United States Patent
Thomas et al.

(10) Patent No.: US 7,511,989 B2
(45) Date of Patent: Mar. 31, 2009

(54) MEMORY CELLS IN DOUBLE-GATE CMOS TECHNOLOGY PROVIDED WITH TRANSISTORS WITH TWO INDEPENDENT GATES

(75) Inventors: Olivier Thomas, Revel (FR); Marc Belleville, Saint-Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 2 days.

(21) Appl. No.: 11/683,722

(22) Filed: Mar. 8, 2007

(65) Prior Publication Data

US 2007/0211519 A1    Sep. 13, 2007

(30) Foreign Application Priority Data

Mar. 10, 2006    (FR)    ................... 06 50824

(51) Int. Cl.
*G11C 11/00* (2006.01)
(52) U.S. Cl. ................... 365/154; 365/230.03; 257/369
(58) Field of Classification Search ................ 365/154, 365/230.03; 257/369
See application file for complete search history.

(56) References Cited

U.S. PATENT DOCUMENTS

| | | | |
|---|---|---|---|
| 6,442,060 B1 | 8/2002 | Leung et al. | |
| 6,731,533 B2 | 5/2004 | Deng et al. | |
| 2005/0169090 A1* | 8/2005 | Shau | 365/230.03 |
| 2005/0199964 A1* | 9/2005 | Sekigawa et al. | 257/369 |
| 2006/0274569 A1* | 12/2006 | Joshi et al. | 365/154 |
| 2007/0189060 A1 | 8/2007 | Inaba | |
| 2007/0211519 A1 | 9/2007 | Thomas et al. | |

FOREIGN PATENT DOCUMENTS

EP    1 465 200 A1    10/2004

OTHER PUBLICATIONS

Kiyoshi Takeuchi, et al. "A Study of the Threshold voltage Variation for Ultra-Small Bulk and SOI CMOS", IEEE Transactions on Electron Devices, XP-011017796, vol. 48, No. 9, Sep. 2001. pp. 1995-2001.
Hari Ananthan, et al. "FinFET SRAM-Device and Circuit Design Considerations", Quality Electronic Design, XP-010695543, Mar. 22, 2004, pp. 511-516.
Shigeto Maegawa, et al. "A 0.4 μm Gate-All-Around TFT (GAT) Using a Dummy Nitride Pattern for High-Density Memories", Japanese Journal of Applied Physics, XP-000599414, vol. 34, No. 2B, Part 1, Feb. 1, 1995, pp. 895-899.
Amit Agarwal, et al. "DRG-Cache: A Data Retention Gated-Ground Cache for Lowpower", DAC, Jun. 2002, pp. 473-478.
Navid Azizi, et al. "Low-Leakage Asymmetric-Cell SRAM", IEEE Transactions on Very Large Scale Integration (VLSI) Systems, vol. 11, No. 4, Aug. 2003, pp. 701-715.

(Continued)

*Primary Examiner*—Huan Hoang
*Assistant Examiner*—Fernando N Hidalgo
(74) *Attorney, Agent, or Firm*—Oblon, Spivak, McClelland, Maier & Neustadt, P.C.

(57) ABSTRACT

This invention relates to an improved microelectronic RAM memory device, provided with 4T or 6T cells made using the double gate technology and each associated with two word lines.

13 Claims, 10 Drawing Sheets

OTHER PUBLICATIONS

Krisztian Flautner, et al. "Drowsy Caches: Simple Techniques for Reducing Leakage Power", International Symposium on Computer Architecture, (ISCA'2002), 10 pages.

L. Mathew, et al. "CMOS Vertical Multiple Independent Gate Field Effect Transistor (MIGFET)", IEEE International SOI Conference, 2004, pp. 187-189.

Koichi Takeda, et al. "A 16-Mb 400-MHz Loadless CMOS Four-Transistor SRAM Macro", IEEE Journal of Solid-State Circuits, vol. 35, No. 11, Nov. 2000, pp. 1631-1640.

Kenichi Osada, et al. "16.7-fA/Cell Tunnel-Leakage-Suppressed 16-Mb SRAM for Handling Cosmic-Ray-Induced Multierrors", IEEE Journal of Solid-State Circuits, vol. 38, No. 11, Nov. 2003, pp. 1952-1957.

Evert Seevinck, et al. "Static-Noise Margin Analysis of MOS SRAM Cells", IEEE Journal of Solid-State Circuits, vol. sc-22, No. 5, Oct. 1987, pp. 748-754.

M. Vinet, et al. "Planar Double Gate CMOS Transistors With 40nm Metal Gate for Multipurpose Applications", SSDM, 2004, 2 pages.

Masanao Yamaoka, et al, "Low Power SRAM Menu for SOC Application Using Yin-Yang-Feedback Memory Cell Technology", Symposium on VLSI Circuits, Digest of Technical Papers, Jun. 2004, 4 pages.

Jakub Kedzierski, et al. "High-Performance Symmetric-Gate and CMOS-Compatible Vt Asymmetric-Gate FinFET Devices", International Electron Devices Meeting, 2001, pp. 437-440.

G. Ilicali, et al. "Planar Double Gate Transistors With Asymmetric Independent Gates", IEEE International SOI Conference, 2005, pp. 126-127.

Ching-Huang Lu, et al. "Characteristics and Mechanism of Tunable Work Function Gate Electrodes Using a Bilayer Metal Structure on $SiO_2$ and $HfO_2$", IEEE Electron Device Letters, vol. 26, No. 7, Jul. 2005, pp. 445-447.

L. Mathew, et al. "Multiple Independent Gate Field Effect Transistor (MIGFET)-Multi-Fin RF Mixer Architecture, Three Independent Gates (MIGFET-T) Operation and Temperature Characteristics", Symposium on VLSI Technology Digest of Technical Papers, 2005, pp. 200-201.

U.S. Appl. No. 12/169,264, filed Jul. 8, 2008, Thomas, et al.

* cited by examiner

MEMORY CELLS IN DOUBLE-GATE CMOS TECHNOLOGY PROVIDED WITH TRANSISTORS WITH TWO INDEPENDENT GATES

TECHNICAL DOMAIN

The invention relates to the domain of random access memories (RAM), and particularly relates to a static random access memory cell structure developed in double gate technology and provided with transistors comprising two gates controlled independently of each other. Such a cell structure is in particular provided with an improved static noise measurement (SNM) margin in read. The invention also relates to a memory with a plurality of such cells.

PRIOR ART

A classical SRAM (static random access memory or static RAM) cell also comprises two invertors 10, 11, connected in a so-called <<flip-flop>> configuration and two access transistors 12, 13 connected to so-called bit lines 15 and 16, and controlled by a word line 17 (FIG. 1).

The characteristics required for a memory cell are:
  good stability during the different read, write, retention operations performed on the cell,
  the largest possible conducting or loading current to give the cell a high working speed,
  a minimum cell size to be able to make a memory with a high cell integration density,
  the lowest possible retention current so as to minimize the consumed static power.

These criteria are contradictory to each other and make it essential for memory designers to make compromises.

SRAM cells with six transistors called <<6T cells>> provide a good compromise between all the above mentioned criteria.

Compact SRAM memory cells with four transistors called <<4T cells>> and that can give a high integration density have also been developed. These 4T cells include a so-called <<4T-2R>> type cell that has a high retention current and for which the ratio of the corresponding widths between the conduction transistors and the access transistors is high to give good stability.

Document [1] (referenced at the end of this description in the same way as all other documents mentioned in this application) has another type of 4T cell called <<4T-Loadless>>. Compared with the 4T-2R cell, load resistances of the 4T-Loadless cell are replaced by TFT (Thin Film Transistor) type transistors, which can reduce the forward current. A 4T-Loadless cell is approximately the same size as a 4T-2R cell and has a much lower consumption than the 4T-2R cell, but it is sensitive to temperature and dispersions between transistors, for example in terms of doping, length and width. In order to compensate for the lack of a loading system in this type of cell, additional circuits have to be provided in order to refresh memorized information.

Low consumption SPAm cells are presented in document [2], disclosing a memory cell provided with transistors with several threshold voltages or <<multi-VT>> transistors, and in documents [3], [4], and [5] that disclose voltage modulation cells. In cells with voltage modulation, the dynamic variation of modulated voltages, for example a power supply voltage VDD, and/or a reference voltage VSS, and/or a voltage on a bit line, and/or a voltage on a word line, lead to large latency times. These voltage modulation techniques are not applied at the end of each read or write cycle, so as to limit switching time penalties.

In an attempt to further reduce the sizes of memory cell transistors, transistor parameters such as their channel width W, their channel length L, their threshold voltage $V_T$, their permeability $\mu_0$, their doping Na, and their gate oxide thickness Tox vary. This, as described in documents [6] and [7], causes a significant increase in the sensitivity of transistors to different noise sources such as capacitive coupling, inductive coupling, and power supply noise.

Nowadays, a constant attempt is made to reduce the size of memory cells. Consequently, the development of memory cells with a high noise margin is becoming increasingly a priority.

The stability of a cell may be determined particularly by its static noise margin SNM in read mode, as described in document [8] When making a read access to an SPAM cell, the gain of the inverters is reduced by access transistors starting to conduct. Document [9] proposes a cell with 10 transistors in which storage nodes and bit lines are decoupled during a read cycle, to cancel out this effect.

A memory cell with 8 transistors made in double gate technology with operation similar to that of the memory cell comprising 10 transistors mentioned above, was disclosed in document [10]. Despite a strong improvement in the static noise margin SNM, the cells with 10 transistors and with 8 transistors are very large compared with 6T cells. For memory cells with 4 transistors or 4T cells, the stability of the cell in retention mode creates a problem. Typically, the size of these 4T cells is determined taking account of the best possible compromise between stability in the retention phase and stability in the read phase. Several solutions have been presented to improve the ratio between these stabilities.

Document [11] presents an example microelectronic static RAM device provided with 4T cells formed on a classical substrate also called <<Bulk>>, in which the voltage of the word line is reduced so as to increase the static noise margin. However, 4T cells disclosed in this document have a low conduction current.

In document [12], means of controlling the potential of the substrate of the load transistors are provided to improve the stability in retention. This solution can also be used to set up a cell with very small transistors, for example with a channel length of the order of 0.18 μm.

Documents [13] and [14] disclose a cell called <<4T-SR>>, made with a partially deserted SOI (silicon on insulator) technology, characterized by auto-regulation of storage node loads. This 4T-SR cell can maintain stored information without using a refreshment circuit. A disadvantage of this cell is that it is specific to the partially deserted SOI technology.

The problem arises of finding a new SRAM memory cell structure, firstly with improved stability and static noise margin, while keeping the size satisfactory and possibly improving it.

PRESENTATION OF THE INVENTION

The invention relates firstly to a random access memory cell comprising:
  a first plurality of double gate transistors,
  a first double gate access transistor and a second double gate access transistor arranged between a first bit line and a first storage node, and between a second bit line and a second storage node respectively, a first gate of the first access transistor and a first gate of the second access transistor being connected to a first word line capable of carrying a bias signal, a second gate of the first access transistor and a second gate of the second access transistor being connected to a second word line capable of carrying another bias signal.

The cell may be an SPAM cell.

Said first and second gate of the first access transistor are distinct or are not electrically or mechanically connected to each other.

Said first and second gate of the second access transistor are distinct or are not electrically or mechanically connected to each other.

According to a first embodiment, said cell may be a 6-transistor or 6T cell with, said first plurality of transistors being formed from:
- a first double gate load transistor and a second double gate load transistor, the two gates of the first load transistor being connected to each other, and the two gates of the second load transistor also connected to each other,
- a first double gate conduction transistor and a second double gate conduction transistor, the two gates of the first conduction transistor being connected to each other, the two gates of the second conduction transistor also being connected to each other.

According to a second embodiment, said cell may be a 4-transistor or 4T cell, said first plurality of transistors being formed from:
- a first double gate load transistor and a second double gate load transistor, the two gates of the first load transistor being connected to each other and the two gates of the second load transistor also being connected to each other.

The random access memory cell according to the invention may comprise asymmetric double-gate transistors.

According to one particular embodiment, the first access transistor and the second access transistor may be asymmetric double-gate transistors.

Access transistors may comprise an asymmetric double-gate, with a first gate called the "upper gate" and a second gate called the "lower gate" and defined as the gate among the two gates that generates the lowest current, for identical bias.

In the cell, the second word line may be dedicated to write operations and connected to the lower gate of the access transistors.

According to one possible embodiment, the cell may adopt a retention mode in which the first word line and the second word line are connected respectively to a first so-called <<retention>> potential and a second so-called <<retention>> potential, the first retention potential and the second retention potential being designed to block the first access transistor and the second access transistor.

The first retention potential and the second retention potential may possibly be equal, for example equal to a reference potential VSS.

According to one possible embodiment, the cell can be used in a write mode in which the first word line and the second word line are at a first so-called <<write>> potential and a second so-called <<write>> potential respectively, the first write potential and the second write potential being designed to make the first access transistor and the second access transistor conducting or saturated.

The first write potential and the second write potential may possibly be equal, for example to a power supply potential VDD.

According to one possible embodiment, the random access memory cell can adopt a read mode in which the first word line and the second word line are equal to a first so-called <<read>> potential and a second so-called <<read>> potential respectively, the first read potential and the second read potential being different. In read mode, only one of the two word lines can be activated, for example such that one of the two word lines is at a power supply potential VDD, while the other word line is at a potential less than VDD, for example at a reference potential VSS.

According to one particular embodiment of the random access memory cell, the first read potential and/or the second read potential may be less than the first write potential and the second write potential respectively. In read mode, one of the two word lines may for example be at a potential less than the potential VDD, for example at a potential VDD–$V_T$, where $V_T$ is a transistor threshold voltage, while the other word line is at a reference potential VSS.

The invention also relates to a microelectronic device with a random access memory, comprising a plurality of cells like those described above.

According to one possible implementation of this microelectronic device with random access memory, the cells may be arranged in a matrix divided into at least two blocks one comprising a first plurality of word line pairs and the other comprising a second plurality of word line pairs, the device also comprising:
- means for selecting a block of cells,
- means for activating word lines, capable of activating one or several word lines in a selected block, independently from word lines belonging to the other block.

According to another possible implementation of this microelectronic device with random access memory in which the cells are arranged as a matrix, the device may also comprise:
- means forming a first line or column decoder of the matrix connected to a first plurality of word lines dedicated to read and write operations,
- means forming a second column or line decoder of the matrix connected to a second plurality of word lines dedicated to write operations.

BRIEF DESCRIPTION OF THE FIGURES

This invention will be better understood after reading the description of example embodiments given purely for information and in no way limitatively, with reference to the appended figures, wherein.

Identical, similar or equivalent parts in the different figures are marked with the same numbers so as to facilitate cross-referencing between them.

The different parts shown on the figures are not necessarily shown at the same scale, to make the figures more easily understandable.

DETAILED PRESENTATION OF PARTICULAR EMBODIMENTS

Figure 1:
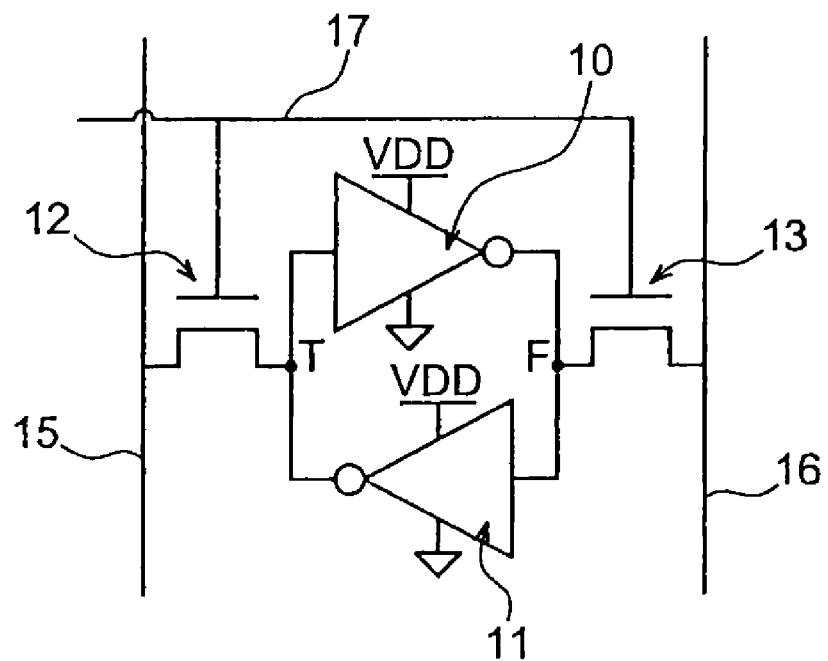
FIG. 1 illustrates an example of a static random access memory cell according to prior art.
Figure 2A:
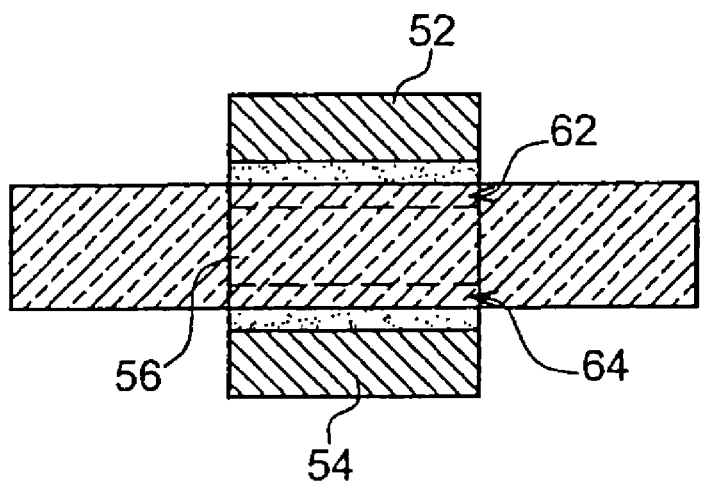
FIG. 2A is a sectional view illustrating an example double gate transistor in a memory cell according to the invention.

The invention uses a random access memory (RAM) cell provided with transistors made using the double gate technology, for example of the CMOS (<<Complementary Metal Oxide Semiconductor>>) type. Transistors made using the double gate technology means that these transistors comprise two gates G1, G2 in the form of a first and a second zone 52, 54 based on a gate material, made on each side of an activated zone 56, for example formed below and above an activated zone 56 respectively, and electrically or mechanically connected to corresponding bias means. The two zones 52, 54 based on a gate material may possibly be distinct or separate from each other and not mechanically or electrically connected to each other. In a transistor made using the double gate technology, the activated zone 56 may comprise a first region 62 located facing the first gate material zone 52 and designed to form a first channel, and a second region 54 located facing the second gate material zone 54 and designed to form a second channel. Such a double gate transistor is illustrated in a sectional view in FIG. 2A.

A random access memory cell structure according to the invention comprises a set of transistors, for example access transistors, provided with two electrically independent gates G1, G2, or that are not connected to each other, and that are connected to first bias means and second bias means distinct from the first bias means, respectively. The first bias means and the second bias means may comprise a first conducting or connection line called the <<first word line>> capable of carrying a bias potential, and a second conducting or connection line called the <second word line>> capable of carrying a second bias potential, respectively. The cell also comprises a second set of transistors, for example conduction and/or load transistors comprising a double gate provided with two gates electrically or mechanically connected to each other.

The transistors in the cell are also used such that the current Ids between the drain and the source can adopt at least three different levels, depending on the way in which their two gates are biased.

Figure 2B:
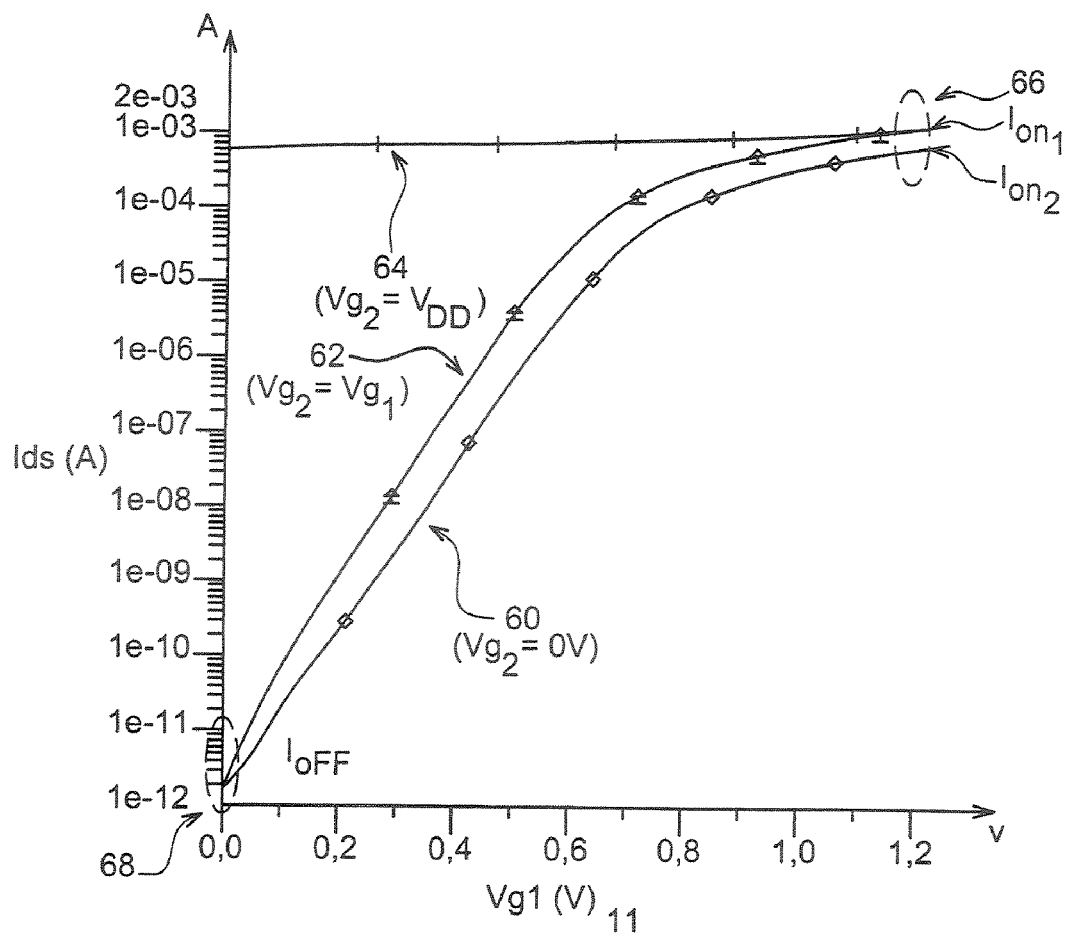
FIG. 2B illustrates an example current-voltage characteristic of said double-gate transistor.

The electrical characteristics of a double gate transistor in a memory cell used according to the invention are illustrated in FIG. 2B, showing three bias curves 60, 62, 64.

In this figure, a first bias curve 60 is representative of the variation of the drain-source current Ids as a function of a potential Vg1 applied to a first gate of the transistor when the second gate of the transistor is in a first bias state and a potential Vg2=0 Volt is applied to the second gate. The first curve 60 shows that for a bias such that the potential Vg2=0 volt is applied to the second gate, can give the lowest current $I_{OFF}$ in the blocked state and the lowest saturation current $I_{ON2}$ of the transistor.

A second bias curve 62 is representative of the variation of the drain-source current Ids as a function of a potential Vg1 applied to the first gate of the transistor, when the second gate of the transistor is in a second bias state and a potential Vg2=Vg is applied on the second gate. The second curve 62 shows that for a bias such that a potential Vg2=Vg1 is applied to the second gate, the result can be the lowest current $I_{OFF}$ in the blocked state of the transistor and the highest current $I_{ON1}$ in the saturated state. A bias such that Vg2=Vg1 can give the highest ratio $I_{ON}/I_{OFF}$ of the current in the saturated state to the current in the blocked state.

A third bias curve 64 is representative of the variation of the drain-source current Ids as a function of a potential Vg1, applied to the first transistor gate, when the second transistor gate is in a third bias state and a potential Vg2=VDD, where VDD is a power supply potential of the cell is applied to the second gate. For the third bias state such that Vg2=VDD, the highest transistor saturation current $I_{ON1}$ can be obtained when Vg1=VDD, and the lowest transistor saturation current $I_{ON2}$ can be obtained when Vg1=0 volt.

For gates G1 and G2 with a critical size of the order of 40 nanometers, the current $I_{ON}$ (zone reference 66 in FIG. 2B) in the conducting state of the transistor may for example be of the order of 1 mA or may for example be between 0.4 mA and 0.6 mA for a bias voltage of the order of 1.2 volts, while the current $I_{OFF}$ (zone reference 68 in FIG. 2B) in the blocked state is lower and may for example be of the order of 1 pA, for example between 2 pA and 0.9 pA.

Figure 3:
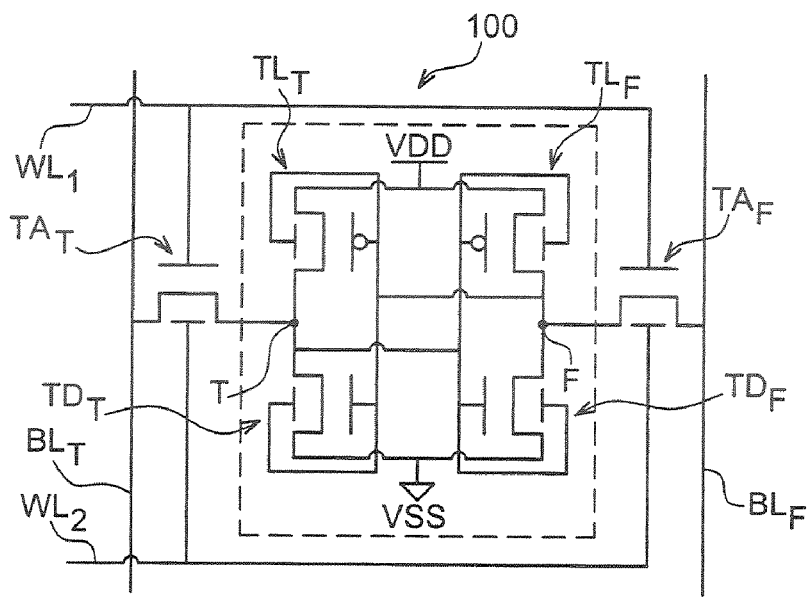
FIG. 3 illustrates a first example memory cell according to the invention, provided with 6 double gate transistors and two word lines.

A first example memory cell according to the invention is illustrated in FIG. 3. This cell reference 100 is a so-called <<6T>> SRAM type cell provided with 6 transistors made using the MOS (<Metal Oxide Semi-conductor>>) technology, or a double gate technology. The cell 100 comprises a first double gate load transistor $TL_T$, and a second double gate load transistor $TL_F$. The load transistors $TL_T$ and $TL_F$, may be made using a first given type of MOS technology, for example a PMOS type technology. The two gates in the first double gate load transistor $TL_T$ are connected to each other, while the two gates of the second double gate load transistor $TL_F$ are also connected to each other. The double gate of the second charge transistor $TL_F$ is also connected to a first load node T of the cell 100, while the double gate of the second load transistor $TL_T$ is connected to a second storage node F of the cell 100. The sources of the load transistors $TL_T$, $TL_F$ are connected to each other and to a power supply potential VDD. The power supply potential VDD may for example be of the order of 1.2 volts for gates with a critical size of the order of 40 nanometers. The power supply potential VDD can be adapted as a function of the target application for the cell 100. For an application in which low consumption is preferred for the cell 100, the power supply potential may for example be reduced and be less than 1.2 volts.

The drain of the first load transistor $TL_T$ and the drain of the second load transistor $TL_F$, are connected to the first storage node T of the cell 100 and to the second storage node F of the cell 100 respectively. The cell 100 also comprises a first double gate conduction transistor $TD_T$, and a second double gate conduction transistor $TD_F$. The conduction transistors $TD_T$ and $TD_F$ may be made using a MOS technology type complementary to said first type, for example an NMOS technology. The two gates of the first conduction transistor $TD_T$ are connected to each other, while the two gates of the second conduction transistor $TD_F$ are also connected to each other. The double gate of the first conduction transistor $TD_T$ is also connected to the second storage node F, while the second gate of the second conduction transistor $TD_F$ is connected to the first storage node T of the cell 100. The sources of the conduction transistors $TD_T$, $TD_F$ are connected to each other and to a reference potential VSS. The reference potential may for example be of the order of 0 volt. The power supply potential VSS may be adapted depending on the target application for the cell 100, for example it may be increased for example to more than 0 volt to limit consumption of the cell 100, or it may be reduced for example to less than 0 volts to improve the stability of the cell 100. The drain of the second conduction transistor $TD_F$ and the drain of the first conduction transistor $TD_T$ are connected to the second storage node F of the cell 100 and to the first storage node T of the cell 100 respectively.

The load transistors $TL_T$, $TL_F$ and the conduction transistors $TD_T$, $TD_F$ form a bistable for the cell 100 and are designed to control and maintain information kept by storage nodes T, F. The first storage node T may be designed to retain a given logical information, while the second storage node F is designed to keep logical information complementary to the logical information.

The cell 100 is also provided with a first double gate access transistor $TA_T$ and a second double gate access transistor $TA_F$, for example of the NMOS type. The first access transistor $TA_T$ comprises a gate connected to a first word line $WL_1$ and another gate connected to a second word line $WL_2$. The first word line $WL_1$ and the second word line $WL_2$ will carry a first bias potential and a second bias potential respectively. The manner in which the word lines $WL_1$ and $WL_2$ are polarized determines the different operating phases of the cell 100: read, write and retention. The second access transistor $TA_F$ is also provided with a gate connected to the first word line $WL_1$ and a second gate connected to the second word line $WL_2$. The source of the first access transistor $TA_T$ is connected to a first bit line $BL_T$, while the source of the second access transistor $TA_F$ is connected to a second bit line $BL_F$. The bit lines $BL_T$ and $BL_F$ are capable in particular of transmitting data to be written in the cell. The drain of the first access transistor $TA_T$ is connected to the first node T, while the drain of the second access transistor $TA_F$ is connected to the second node F. The access transistors $TA_T$, $TA_F$, are arranged to access the storage nodes T and F during a read or a write phase of the cell 100 and to block access to cell 100, while the cell 100 is in an information retention mode.

Figure 4:
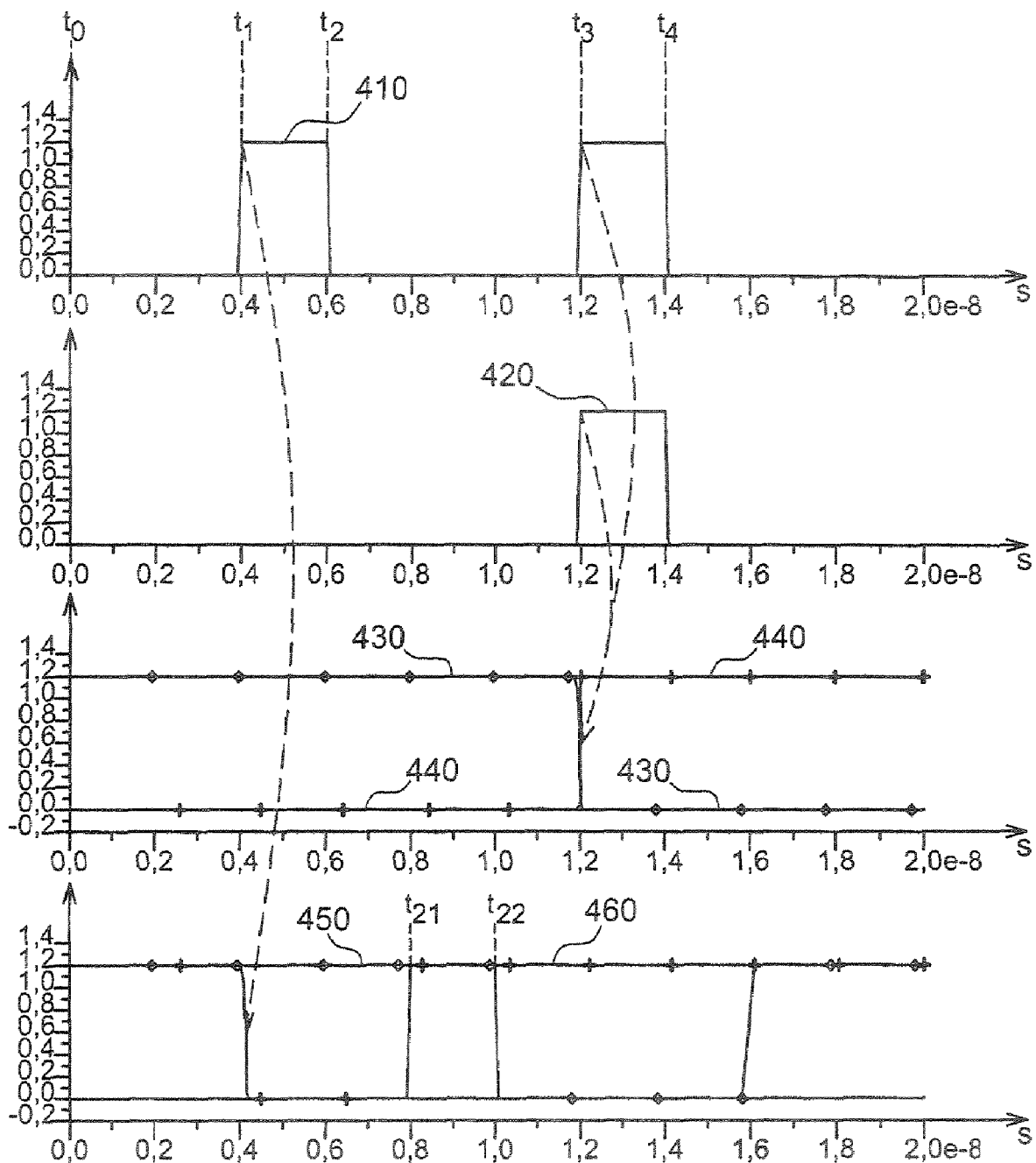
FIG. 4 illustrates an operational time diagram of the first example cell according to the invention.

An example operation of the memory cell 100 that has just been described will now be given with reference to the time diagram in FIG. 4. The different operating phases of the cell 100 are illustrated on this time diagram in curves 410, 420, 430, 440, 450, 460, showing the variation of the potential of the first word line $WL_1$, the potential of the second word line $WL_2$, the potential of the first node T, the potential of the second node F, the potential of the first bit line $BL_T$, and the potential of the second bit line $BL_F$, respectively.

On this time diagram, the cell 100 is put into retention mode between time $t_0$ and time $t_1$. Information retained by the cell 100 $t_0$ and $t_1$ may for example be a logical '0' level (curve 440 in the low state) at the second node F, and a logical '1' level (curve 430 in the high state) at the first node T. The word lines $WL_1$, $WL_2$, are set to a first so-called <<retention>> potential and a second so-called <<retention>> potential equal to the first retention potential, respectively. The first retention potential and the second retention potential may be chosen so as to block the access transistors $TA_T$, $TA_F$, or access the storage nodes T and F. The first retention potential and the second retention potential may for example be equal to the reference potential VSS (curves 410 and 420 in a low state). During the retention phase, the word lines $WL_1$, $WL_2$, are said to be <<deactivated>>.

Before entry into a read phase at time $t_1$, the bit lines $BL_T$, $BL_F$, may be biased at the same potential, for example at the reference potential VSS (curves 450 and 460 in the low state) between time to and time $t_1$.

At time $t_1$, the cell 100 changes to read mode. This changes the bias of one of the two word lines $WL_1$, $WL_2$, for example of the first word line $WL_1$, which at time $t_1$ is set to a so-called <<read>> potential different from the read potential that it had during retention mode, for example at the power supply potential VDD (curve 410 changing to the high state) while the other of the two word lines, for example the second word line $WL_2$, is kept at a so-called <<read>> potential equal to the read potential that it had during retention mode, for example equal to the reference potential VSS (curve 420 remaining in the low state). The change in the bias of one of the two word lines $WL_1$, $WL_2$, at time $t_1$, leads to or is followed by a change in the potential of one of the bit lines, for example the second bit lines $BL_F$ (change of curve 460 to a low state), while the other bit line, for example the first bit line $BL_T$ is kept at the same potential. During the read phase, the access transistors $TA_T$ and $TA_F$ are biased through word lines $WL_1$ and $WL_2$, so as to enable access to storage nodes T and F, while preventing information on these nodes T and F from being modified. During the read phase, the word lines $WL_1$, $WL_2$, are at different potentials. One of the two word lines, for example the first word line $WL_1$, is said to be <<activated>> while the second of the two word lines is said to be <<deactivated>>, for example the second word line $WL_2$. In read mode, the stability of the cell 100 depends firstly on the relation between the conduction currents of the second conduction transistor $TD_F$ and the second access transistor $TA_F$, for example to maintain the logical level '0' at the second node F, and secondly the current output by the load transistor $TL_T$ to maintain the logical level '1' at the first node T. The arrangement of the transistors in the cell 100 and their bias during the read phase, are designed such that the conduction current ICELL passing through the second access transistor $TA_F$ is less than the conduction current of the second conduction transistor $TD_F$. The arrangement of the transistors in cell 100 and their bias during the read phase may also be arranged such that the current output by the first load transistor $TL_T$ compensates for load losses at the first node T passing through the first conduction transistor $TD_T$. This can give a maximum static noise margin, for example of the order of 352 mV. Activating only one of the two word lines WL1 and WL2 during the read phase, as illustrated in FIG. 2B, provides a means of limiting the conduction current ICELL and thus very much improving the stability of the cell 100. During the read phase, the second access transistor $TA_F$ has a single activated channel, while the first load transistor $TL_T$ and the second conduction transistor $TD_F$ have both of their channels active.

At time $t_2$, the potential of the first word line $WL_1$ is once again modified and for example changes to the reference potential VSS (the curve 410 changes to the low state). The potentials of the first word line $WL_1$ and the second word line $WL_2$ are equal and are generated so as to once again block access to nodes T and F, and once again to bring cell 100 into retention mode. At time $t_{21}$ located after the read phase and before the write phase, the second bit line BLF is reloaded (the curve 460 changes to the high state). Then, the first bit line BLT is initialized at time $t_{22}$, before the write phase (curve 450 changes to the low state).

Between time $t_3$ and time $t_4$, the cell 100 is placed in a write phase or mode. In write mode, the two word lines $WL_1$ and $WL_2$ are biased by a first so-called <<write>> potential and a second so-called <<write>> potential respectively, chosen so as to activate the access transistors, or to make them conducting or to saturate them. The two word $WL_1$ and $WL_2$ may be put at the same potential, for example the power supply potential VDD (curves 450 and 460 in the high state) during the write phase. The arrangement of the access transistors $TA_T$ and $TA_F$ of the cell 100, and the corresponding bias potentials of the two word lines $WL_1$ and $WL_2$ are chosen for the write phase, so as to generate a conduction current ICELL to switch the cell 100 (change state of curves 430 and 440). Cell 100 is switched, or the potentials of the first node T and the second node F respectively, are changed with the potential difference between the bit data lines $BL_T$ and $BL_F$, as low as possible. During the write phase, the word lines $WL_1$, $WL_2$, are at identical potentials. In write mode, the first word line $WL_1$ and the second word line $WL_2$ are said to be <activated>>.

The electrical characteristics of the cell 100 that have just been described are better than the electrical characteristics of a 6T cell according to prior art, for example developed using the CMOS technology and with exactly the same size of transistors as for cell 100. For example, the static noise margin of the cell 100 may be improved by 100 mW or of the order of 40%. With such an improvement, the cell 100 can be supplied with a lower power supply voltage VDD, for example between 700 mV and 800 mV.

Figure 5:
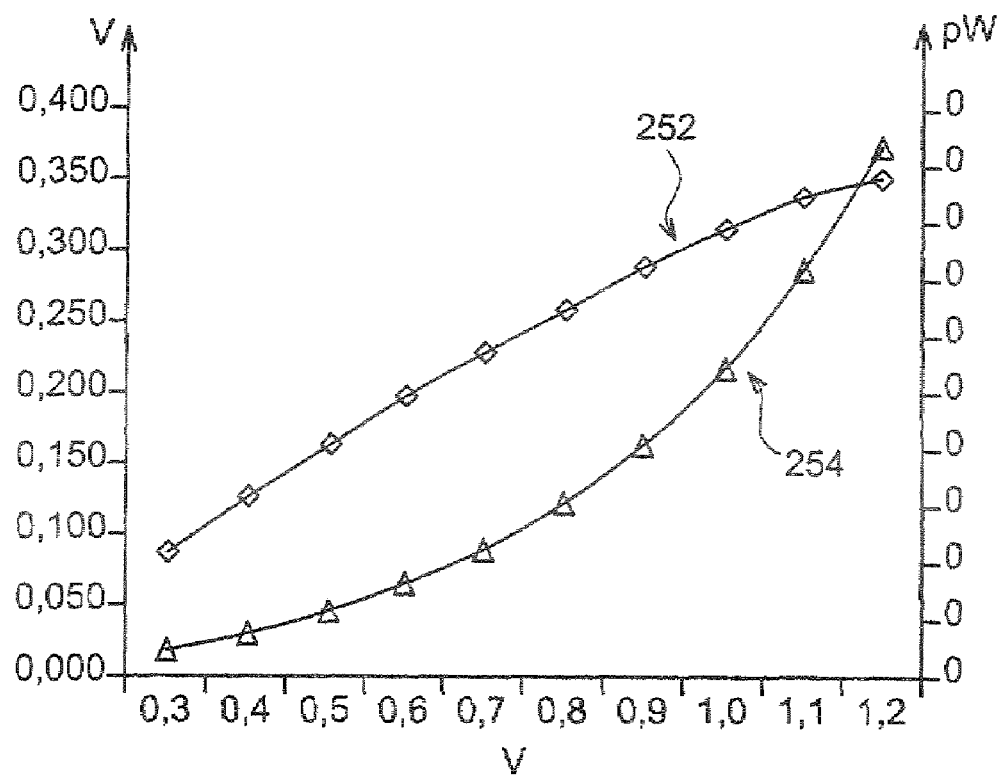
FIG. 5 illustrates static noise margin (SNM) and static power curves for the first example cell according to the invention as a function of a power supply voltage of this cell.

FIG. 5 illustrates the electrical performances of the cell 100. On this figure, curve 252 shows the variation of the static noise margin of the cell 100 as a function of its power supply voltage VDD, and curve 254 shows the variation of the static power of the cell 100 as a function of the power supply voltage VDD. For a power supply difference of about 400 mV, the static noise margin of the cell 100 and of a standard 6T cell may be equal, but the consumption of the cell 100 will be three times lower than the consumption of the standard 6T cell.

Figure 6:
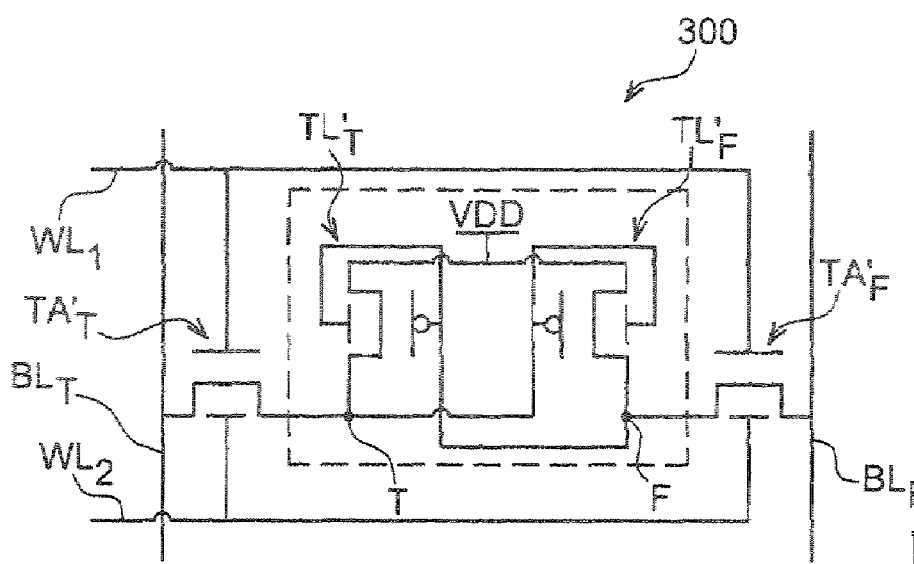
FIG. 6 illustrates a second example of a 4T memory cell according to the invention, provided with 4 double gate transistors and two word lines.

A second example random access memory cell 300 according to the invention is illustrated in FIG. 6. This memory cell 300 is a 4T cell provided with 4 transistors made in double gate technology. The transistors may be MOS type transistors. The memory cell 300 is smaller than the memory cell 100 described above with reference to FIG. 3.

The cell 300 comprises a first double gate load transistor $TL'_T$, and a second double gate load transistor $TL'_F$. The load transistors $TL'_T$ and $TL'_F$, may be made using a first type of MOS technology, for example a PMOS type technology. The two gates of the first load transistor $TL'_T$ are connected to each other, while the two gates of the second load transistor $TL'_F$ are also connected to each other. The double gate of the second load transistor $TL'_F$ is also connected to a first storage node T of the cell 300, while the double gate of the first load transistor $TL'_T$ is also connected to a second storage node F of the cell 300. The sources of the load transistors $TL'_T$, $T_F$, are connected to each other and to a power supply potential VDD, while the drain of the first load transistor $TL'_T$ is connected to the first node T and the drain of the second load transistor $TL'_F$ is connected to the second node F. The load transistors $TL'_T$ and $TL'_F$ are designed to maintain a load necessary to set up a given logical level, for example '1', for example corresponding to a potential equal to the power supply potential VDD, on one of the two nodes T or F, as a function of the logical value memorized in the cell 300.

The cell 300 is also provided with a first double gate access transistor $TA'_T$ and a second double gate access transistor $TA'_F$, for example of the NMOS type. The first access transistor $TA'_T$ comprises a gate connected to a first word line $WL_1$ and another gate connected to a second word line $WL_2$. The second access transistor $TA'_F$ also comprises a gate connected to the first word line $WL_1$ and a second gate connected to the second word line $WL_2$. The source of the first access transistor $TA'_T$ is connected to a first bit line $BL_T$, while the source of the second access transistor $TA'_F$ is connected to a second bit line $BL_F$. The drain of the first access transistor $TA'_T$ is connected to the first storage node T, while the drain of the second access transistor $TA'_F$ is connected to the second storage node F. The access transistors $TA'_T$, $TA'_F$, are arranged to enable access to the storage nodes T and F during a read or write phase of the cell 300, and to block access to cell 300 when the cell 300 is in an information retention mode.

Such a cell 300 can give an improved compromise between the stability in retention and the stability in read. Information stored in retention can be maintained without using refreshment means. Word lines $WL_1$, $WL_2$, are controlled as a function of the mode in which it is required to place the cell 300.

Figure 7:
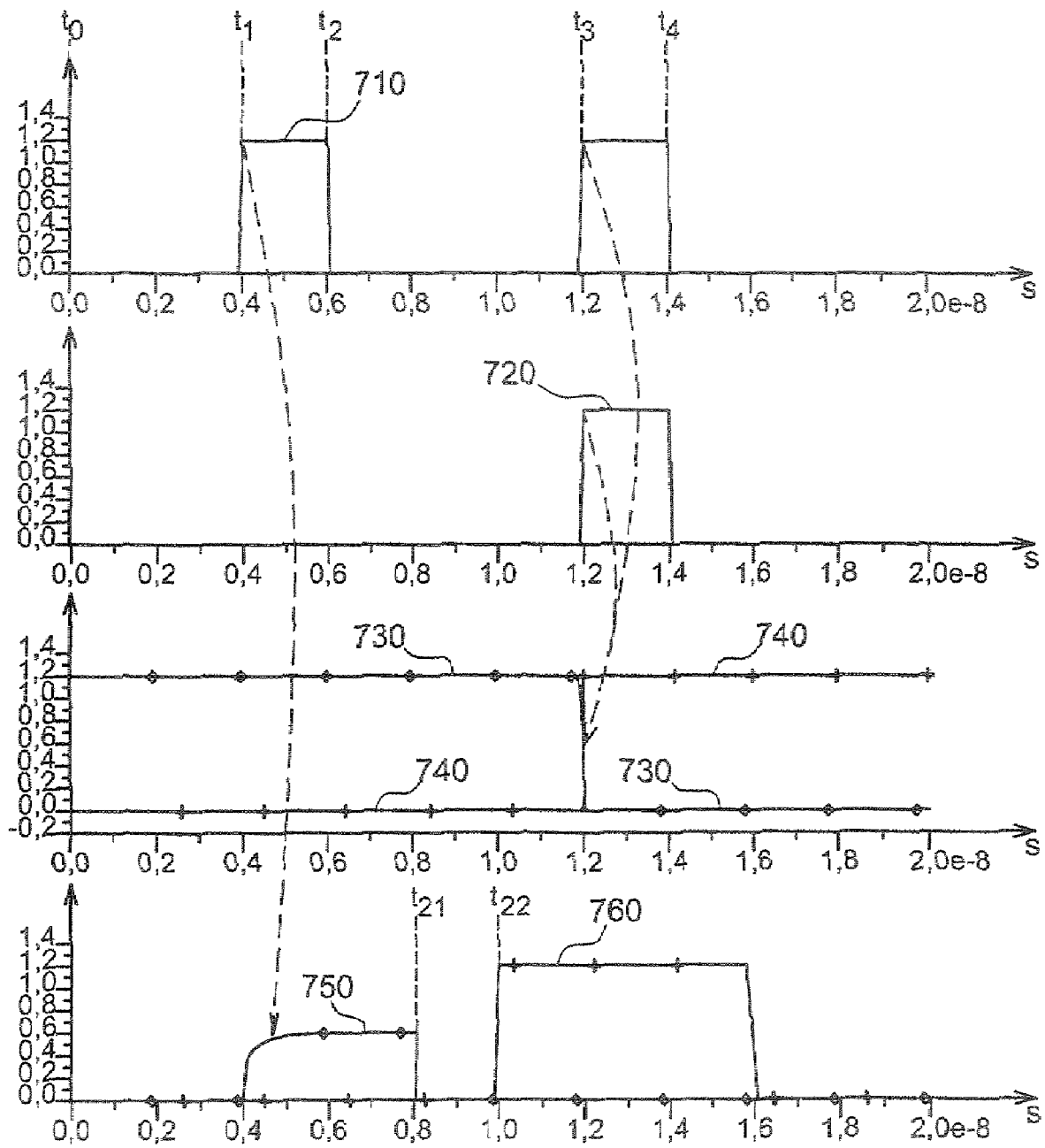
FIG. 7 illustrates an operational time diagram of the second example cell according to the invention.

An operating mode of the second example cell 300 will now be given with reference to the time diagram in FIG. 7. The different states of the cell 300 are illustrated on this time diagram using curves 710 showing the variation of the potential of the first word line $WL_1$, 720 showing the variation of the potential of the second word line $WL_2$, 730 showing the variation of the potential of the first node T, 740 showing the variation of the potential of the second node F, 750 showing the variation of the potential on the first bit line $BL_T$, and 760 showing the variation of the potential on the second bit line $BL_F$.

In this example, the cell 300 initially keeps information such that the first node T is at a logical level '1', and such that the second node F is at a logical level '0'. Between a time to and a time $t_1$ on the time diagram, the cell 300 is put into retention mode. In retention mode, the bit lines $BL_T$, $BL_F$, are at potentials, for example equal to the reference potential VSS (curves 750 and 760 in a low state), and chosen so as to stabilize data memorized in the cell 300, while word lines $WL_1$, $WL_2$, are kept at a first so-called <<retention>> potential and a second so-called <<retention>> potential respectively. The first retention potential and the second retention potential may be equal to each other and for example chosen to be equal to the reference potential VSS, so as to block access to nodes T and F (curve 710 and 720 in a low state). The word lines $WL_1$, $WL_2$, are said to be deactivated in retention mode. In a case in which the first node T is at a logical level T=1 and in which the second node F is at a logical level F=0, the second load transistor $TL'_F$ is also blocked, while the first load transistor $TL'_T$ is conducting. During the retention phase, the arrangement and the bias of transistors in the cell 300 may be designed such that the current passing through the second access transistor $TA'_F$ is greater than sum of the currents passing through the second load transistor $TL'_F$ and the gate current output from the second load transistor $TL'_T$, so as to keep the second node F at the same potential, in other words at a potential close to the reference potential VSS.

Then, starting from time $t_1$ and until time $t_2$, the cell 300 changes to read mode. This results in a change to the potential on only one of the two word lines $WL_1$ and $WL_2$, for example the first word line $WL_1$, that is set equal to a read potential, for example equal to the power supply potential VDD (change of the curve 710 from a low state to a high state), while the other word line, for example the second word line $WL_2$ is maintained at the same potential, for example at the reference potential VSS (curve 720 maintained in the low state) so as to enable access to storage nodes T, F. During the read phase, only one of the two word lines is activated, for example the first word line $WL_1$, so as to enable access to nodes T and F, while maintaining the information present on these nodes. The change in bias of one of the two word lines $WL_1$, $WL_2$ at time $t_1$, causes a change in potential of one of the bit lines, for example the first bit line BLT (change of curve 750 to a high state). The bit line for which the potential changes starting from $t_1$ may be set to a given potential. The given potential may correspond to the potential of the first storage node, reduced by a transistor threshold voltage.

In this example, the stability of the second cell 300 in read mode depends on the relation between conduction currents of the first load transistor $TL'_T$ and the first access transistor $TA'_T$. In order to obtain a high noise margin, the arrangement of the transistors and their bias during the read phase are designed such that the conduction current ICELL that passes through the first access transistor $TA'_T$ is less than the conduction current of the first load transistor $TL'_T$. Activating only one of these two word lines can limit the current line ICELL and thus guarantee high stability of the cell.

Between time $t_2$ and until time $t_3$, the cell 300 once again changes to retention mode.

At a time $t_{21}$ after the read phase and before the write phase, the potential applied on the bit line BLF is modified (the curve 750 changes to the low state) so as to prepare the cell for a write phase. Then at a time $t_{22}$, before the write phase, the second bit line BLF is set to a potential representative of data that will be written during the write phase (the curve 760 changes to the high state). Then at a time $t_3$ and until a time $t_4$, the cell 300 is put in write mode. At time $t_3$, the two word lines $WL_1$ and $WL_2$ are set to so-called <<write>> potentials designed to activate the access transistors $TA'_T$ and $TA'_F$ and generate a maximum conduction current ICELL so as to switch the cell 300 with a low potential difference between the bit lines $BL_T$ and $BL_F$. In the write phase, the two word lines $WL_1$ and $WL_2$ are both activated and may be set to the same potential, for example the power supply potential VDD.

Figure 8:
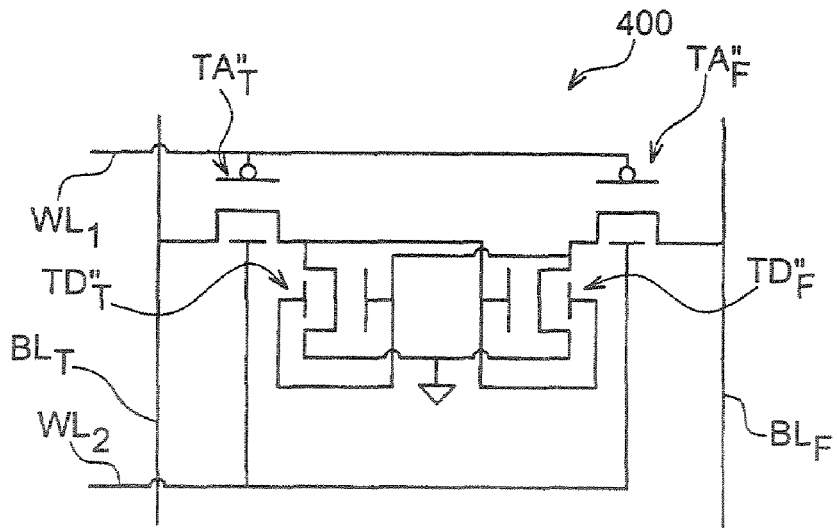
FIG. 8 illustrates a variant of the second example of a 4T memory cell according to the invention, also provided with 4 double gate transistors and two word lines.

A variant of the cell 300 described above is illustrated in FIG. 8. This variant uses a cell 400 with 4 transistors in which the load transistors $TL'_T$ and $TL'_F$ are replaced by a first double gate conduction transistor $TD''_T$ and a second double gate conduction transistor $TD''_F$. The double gate conduction transistors $TD''_T$ and $TD''_F$ may for example be made using a MOS technology complementary to the technology used for the load transistors $TL'_T$ and $TL'_F$ in cell 300, for example an NMOS technology. The cell 400 will be activated by word lines $WL_1$ and $WL_2$, for example to be equal to the complement of that used for cell 300.

The two gates in the first conduction transistor $TD''_T$ are connected to each other, while the two gates of the second load transistor $TD''_F$ are also connected to each other. The double gate of the first conduction transistor $TD''_F$ is connected to a first storage node T of the cell 400, while the double gate $TD''_T$ of the first conduction transistor is also connected to a second storage node F on the cell 400. The sources of the conduction transistors $TD''_T$, $TD''_F$ are connected to each other and to a reference potential VSS, while the drain of the first conduction transistor $TD''_T$ is connected to the first node T and the drain of the second conduction transistor $TD''_F$ is connected to the second anode F.

The cell 400 is also provided with a first double gate access transistor $TA''_T$ and a second double gate access transistor $TA''_F$, for example made using a MOS technology complementary to the MOS technology for transistors $TA''_T$ and $TA''_F$ in cell 300. The first access transistor $TA''_T$ comprises a gate connected to a first word line WL1 and another gate connected to a second word line WL2. The second access transistor $TA''_F$ also comprises a gate connected to the first word line WL1 and a second gate connected to the second word line WL2. The drain of the first access transistor $TA''_T$ is connected to a first bit line $BL_T$, while the drain of the second access transistor $TA''_F$ is connected to a second bit line $BL_F$. The source of the first access transistor $TA''_T$ is connected to the first storage node T, while the source of the second access transistor $TA''_F$ is connected to the second storage node F. The access transistors $TA''_T$, $TA''_F$, are arranged to enable access to storage nodes T and F, during a read or write phase of the cell 400, and to block access to the cell 400 when the cell 400 is in an information retention mode.

The invention is not limited to SRAM memory cells and it may also be applied to dynamic random access memories. In this case, the cell 300 or 400 described above may be associated with a data refreshment circuit.

According to one possible embodiment, the bias of cell 100 or 300 during the read phase may be arranged such that one of the two word lines, for example the second word line WL2, is not activated while the other word line, for example the first word line WL1, is activated and is set to a reduced potential, for example equal to $VDD-V_T$ relative to the potential VDD to which it is set during the write phase, where $V_T$ is a transistor threshold voltage.

According to one possible embodiment of the access transistors of cells 100 and/or 300 and/or 400, the first access transistor and/or the second access transistor may be provided with a first gate adjacent to a given gate dielectric thickness and a second gate adjacent to a second gate dielectric thickness different from the first thickness. This can improve the cell retention stability.

A comparison between the electrical characteristics of the 6T type cell 100 and the 4T type cell 300 described above, and a cell with 6 transistors according to prior art called a <<standard 6T>> cell, will now be given with reference to the table shown below. The electrical characteristics in this table have been obtained for cells 100, 300 and standard 6T cells made with a 40 nm channel length. The cells 100, 300 and the standard 6T cell were used such that they have approximately the same leakage current in retention mode $I_{OFF}$.

|  | Cells | | |
|---|---|---|---|
|  | 6T-standard | Cell 100 | Cell 300 |
| $I_{OFF}$ (pA) | 390 | 390 | 360 |
| $I_{PG}$ (pA) | 9 | 9 | 360 |
| $I_{CELL\ RD}$ (µA) | 180 | 94 | 195 |
| $I_{CELL\ WR}$ (µA) | 180 | 180 | 340 |
| NBL (×10$^6$) | 19.4 | 10.2 | 0.54 |
| SNM (mV) | 251 | 352 | 210 |

-continued

| | Cells | | |
|---|---|---|---|
| | 6T-standard | Cell 100 | Cell 300 |
| WM (mV) | 945 | 948 | 58 |
| WD (ms) | — | — | 0.3 |
| ΣWL (µm$^2$) | 70.3 | 70.3 | 53.05 |

In this table:

a factor denoted NBL represents a number of cells per bit line calculated relative to the access transistor leakage current $I_{PG}$ and a cell conduction current in read mode or dynamic saturation mode of the cell access transistors ICELL_RD, such that (ICELL_RD/$I_{PG}$)>x*$N_{WL}$, where x is a margin factor normally between 5 and 10 and $N_{WL}$ is the number of word lines, a factor ICELL_WR gives the conduction current of the cell in write, static noise margin SNM factors represent the behavior of the cell with regard to read cycles, and the behavior of the cell with respect to write cycles, respectively, a write sensitivity factor WD characterizes the loss of information stored in a cell in retention when writing another cell in the same column, for cell 300, a factor Σ(W*L) gives the sum of the corresponding surfaces of the channels of all transistors in a cell, so as to compare the size of the different cells.

The static noise margin of the cell 100 may be improved by 100 mV, namely of the order of 40% compared with the standard 6T cell. This gain in a static noise margin can mean that a low consumption cell 100 can be used and this cell 100 can be supplied with a power supply voltage VDD, for example between 600 mV and 1.1 volts or between 600 mV and 900 mV, or between 600 mV and 800 mV, less than the power supply voltage of a standard 6T cell.

Concerning cell 300, the path to the ground can be eliminated so that the conduction current ICELL_RD in read mode can be increased by a value of the order of 8% while the write margin can be divided by the order of a factor of 16 compared with the standard 6T cell.

The size can be improved by the order of 30% for cell 300, compared with the standard 6T cell.

A microelectronic static random access memory device provided with a plurality of memory cells 500 used according to the invention and similar to one of cells 100, 300 or 400 described above, is illustrated in FIG. 9. The memory is in a matrix layout and is formed from n columns, each column comprising m cells 500. Each column in the matrix comprises two bit lines $BLT_0$, $BLF_0$, . . . , $BLT_{(m-1)}$, $BLF_{(m-1)}$ and is controlled by a column decoder 550. The m*n memory cells 500 are controlled by 2*m word lines, in which m word lines $WL_{WR0}$, . . . , $WL_{WR(n-1)}$ are capable of controlling a read operation when they are activated, and 2*m word lines $WL_{WR0}$, . . . $WL_{WR(n-1)}$ and $WL_{W0}$, . . . $WL_{W(n-1)}$ which are capable of controlling a write operation (m*(WLW+WLRW)) when they are activated.

The cells with 6 transistors or 4 transistors implemented according to the invention comprise an additional word line that can in particular improve margin in write. It may be envisaged that this word line is only activated during a write cycle.

Figure 9:
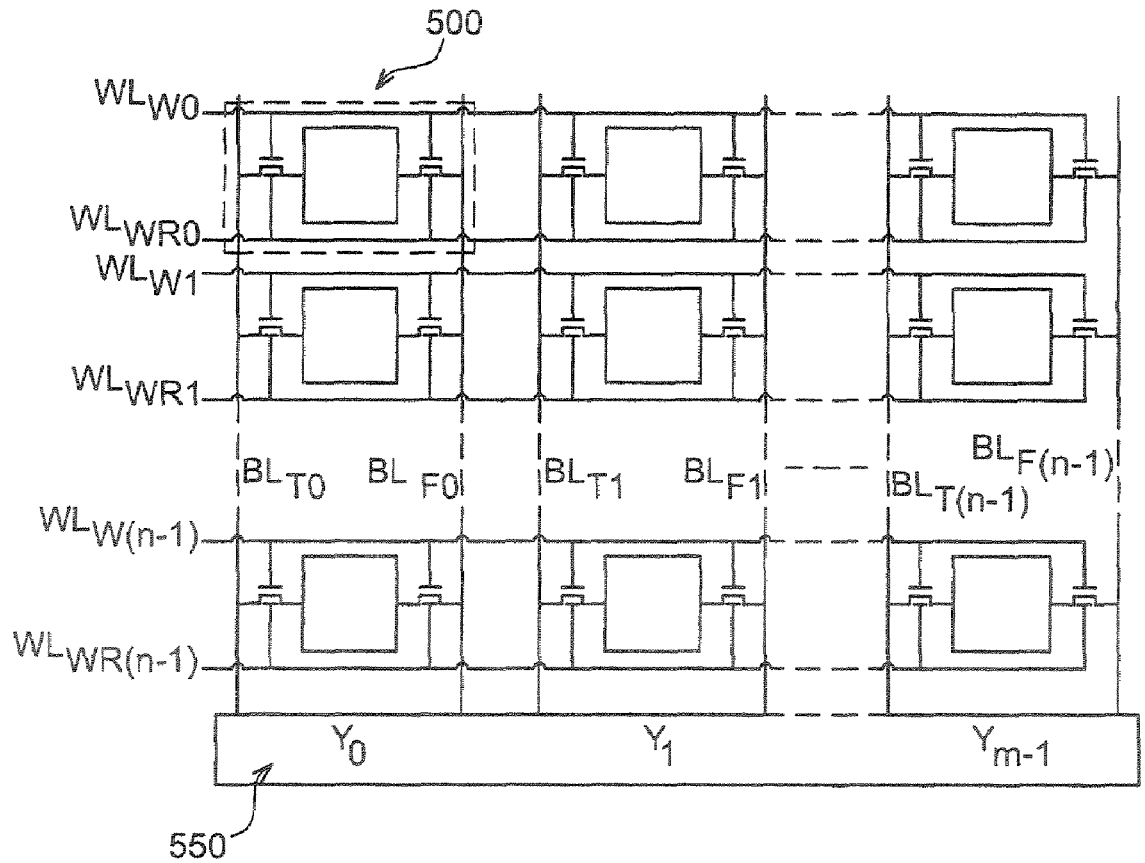
FIG. 9 illustrates a static memory device provided with a matrix of memory cells used according to the invention.

An implantation in a simple, non-multiplexed memory matrix, has been shown in FIG. 9. The difference between this case and a conventional implantation is particularly at the operating level of the line decoder. This decoder may be designed so as to activate the word line dedicated to write, only during a write operation.

Figure 10:
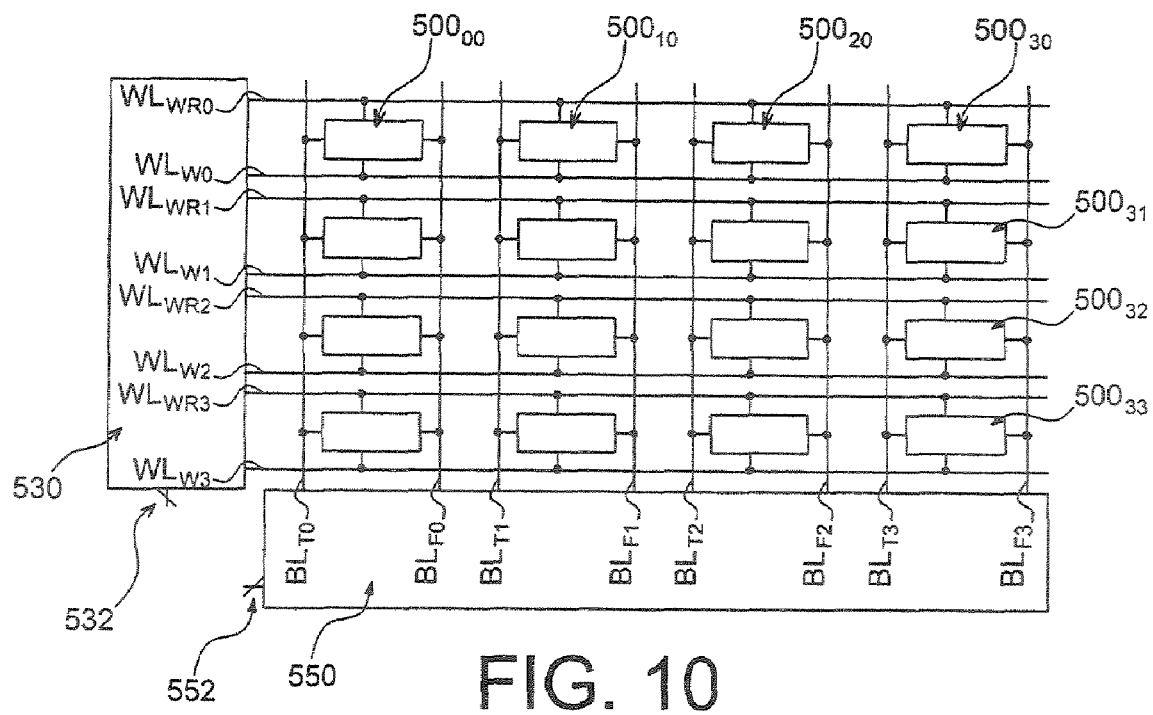
FIG. 10 illustrates one example of a non-multiplexed matrix 4*4 of memory cells according to the invention.

FIG. 10 shows another example of a non-multiplexed memory plane, integrating 4×4 memory cells $500_{00}$, $500_{10}$, $500_{20}$, $500_{30}$, . . . , $500_{30}$, $500_{31}$, $500_{32}$, $500_{33}$ with two word lines implemented according to the invention and similar to one or the other of the cells 100, 300 or 400 described above. Each column in the matrix comprises two bit lines $BL_{T0}$, $BL_{F0}$, . . . , $BL_{T3}$, $BL_{F3}$ and is controlled by means forming a column decoder 550 associated with a data bus 552. Each row in the matrix comprises two word lines $WL_{WR0}$, $WL_{W0}$, . . . , $WL_{WR3}$, $WL_{W3}$ and is controlled by a line decoder 530, associated with an address bus 532. Each row comprises a word line $WL_{WR0}$, or $WL_{WR1}$, or $WL_{WR2}$, or $WL_{WR3}$, dedicated to read and write operations and capable of being activated during read or write operations. Each row also comprises a word line $WL_{W0}$, or $WL_{W1}$, or $WL_{W2}$, or $WL_{W3}$, dedicated to write operations that can be activated only during write operations.

According to one variant, a multiplexed memory matrix may be used to minimize the access current and to improve the stability factor in read. With such a matrix arrangement it is possible to reduce the number of cells to which a bias potential would be applied unnecessarily during a write operation.

Figure 11:
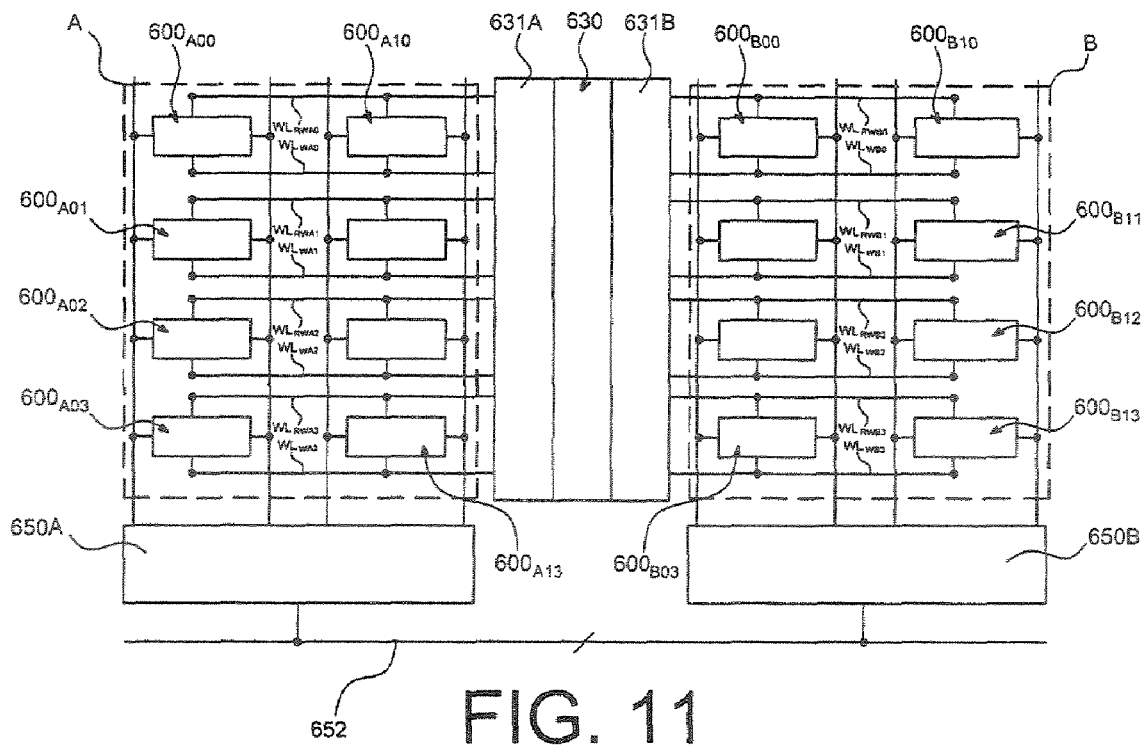
FIG. 11 illustrates one example of a multiplexed matrix 4*4 of memory cells according to the invention.

The matrix may be divided into several addressing blocks, for example in two blocks A and B as shown in FIG. 11.

Such a matrix also integrates memory cells $600_{A00}$, $600_{B00}$, . . . , $600_{A13}$, $600_{B13}$ with 2 word lines, implemented according to the invention and similar to one or the other of cells 100, 300 or 400 described above.

The two blocks comprise a first plurality of word line pairs $WL_{RWA0}$, $WL_{RWA0}$, . . . , $WL_{RWA3}$, $WL_{WA3}$, and a second plurality of word line pairs $WL_{RWB0}$, $WL_{RWB0}$, . . . , $WL_{RWB3}$, $WL_{WB3}$, respectively.

Means forming a line decoder 630 are provided. These means 630 comprise means 631A for selecting a first block A of cells $600_{A00}$, . . . , $600_{A13}$, and means 631B for selecting a second block B of cells $600_{B00}$, . . . , $600_{B13}$.

Each column in the matrix comprises two bit lines and is controlled by means forming a column decoder denoted 650A for the first block A and 650B for the second block B, the decoding means 650A, 650B being associated with a data bus 652.

Each row in the matrix comprises a word line pair of the first plurality of lines $WL_{RWA0}$, $WL_{RWA0}$, . . . , $WL_{RWA3}$, $WL_{WA3}$ belonging to the first block A and a word line pair of the second plurality of lines $WL_{RWB0}$, $WL_{RWB0}$, . . . , $WL_{RWB3}$, $WL_{WB3}$ belonging to the second block B. The word lines of a given row that are associated with a given block, are activated independently of word lines belonging to the same given row but that belong to the other block.

In this example, the matrix is used such that when a write operation is done on a given cell in one of the blocks, for example cell $600_{A00}$ in the first block A, the cells located on the same row as the given cell and belonging to the other block B, for example cells $600_{B00}$, $600_{B00}$ in the second block B located on the same row as the given cell $600_{A00}$, are not activated.

A random access memory cell according to the invention may be provided with asymmetric double-gate transistors. Cells with asymmetric double-gate access transistors can be dangerous, particularly for applications with which it is preferable to adopt a multiplexed memory plane.

An asymmetric double-gate is formed from two separate gates dissymmetric about the main plane of the active semiconducting zone on each side of which these gates are located. The dissymmetry may be geometric, and/or it may be obtained using different gate materials. In a transistor provided with an asymmetric double-gate, the current output between the drain and the source of the transistor is different depending on which of the first gate or the second gate is activated, even for a similar bias. An asymmetric double-gate may be formed from a first gate called the "upper gate" and a second gate called the "lower gate", the "upper" gate being defined as the gate among the two gates that generates the highest current for exactly the same bias.

Figure 12:
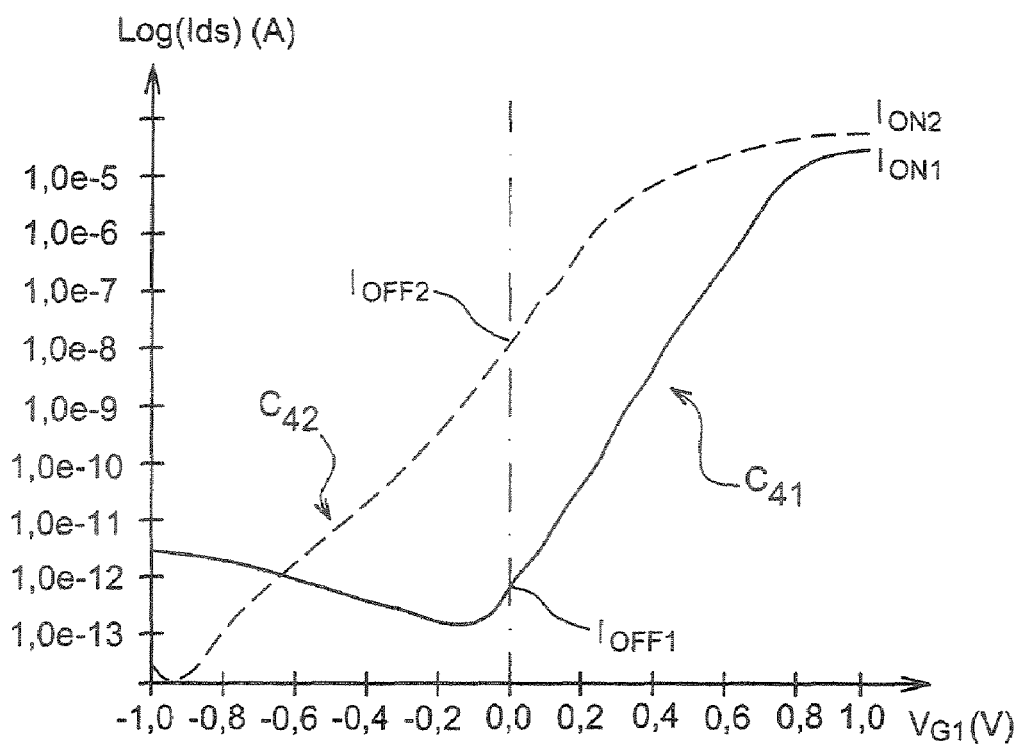
FIG. 12 shows the variation of the channel current for one example of an asymmetric double-gate transistor integrated into a memory cell according to the invention, as a function of the bias of its two gates.

FIG. 12 shows the electrical characteristics of one example of an asymmetric double-gate transistor that can be integrated in a memory cell according to the invention. In this figure, curves $C_{41}$, $C_{42}$ show the variation of the current passing through the active zone of the transistor between its drain and its source, as a function of a potential $V_{G1}$ applied on its upper gate for different fixed values of a potential $V_{G2}$ applied on its lower gate. The curve $C_{41}$ is given for a first value of potential $V_{G2}$ which in this example is 0 volt, while curve $C_{42}$ is given for a second value of potential $V_{G2}$ which in this example is 1 volt. This example transistor is characterised by two on-state currents $I_{ON}$ for a potential applied on the first gate $V_{G1}=VDD$ and a potential applied on the second gate $V_{G1}$ such that $V_{G1}=VG_2=VDD$ and two off-state currents for $I_{OFF}$ for $V_{G1}=0V$ depending on whether $V_{G2}=0V$ or VDD.

Figure 13:
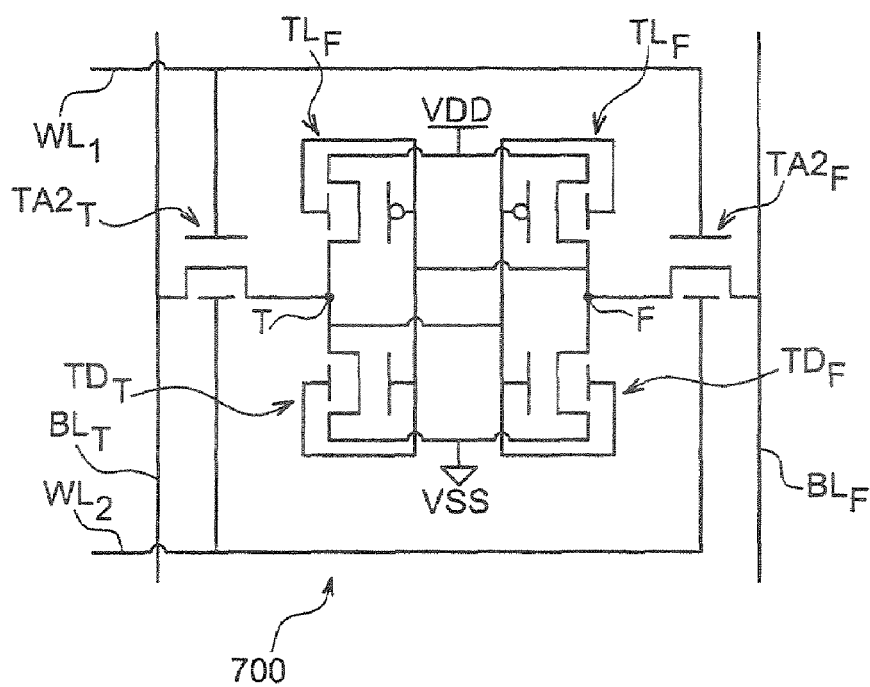
FIG. 13 illustrates one example of a memory cell according to the invention provided with 6 double-gate transistors and two word lines, and including two asymmetric double-gate access transistors.

Another example of a random access memory cell 700 according to the invention is illustrated in FIG. 13. This memory cell 700 is a 6T cell provided with 6 transistors made in double gate technology, that is different from the cell 100 described above with reference to FIG. 3, in that it comprises a first asymmetric double gate access transistor $TA2_T$ and a second asymmetric double gate access transistor $TA2_F$.

The cell 700 comprises a first word line $WL_1$ connected to the upper gate of access transistors $TA2_T$ and $TA2_F$, and a second word line $WL_2$, connected to the lower gate of access transistors $TA2_T$ and $TA2_F$. The second word line $WL_2$ may be dedicated to write operations only and be activated only during a write operation. Depending on how the second word line $WL_2$ is biased, the leakage current of access transistors $TA2_T$ and $TA2_F$ is modulated between two thresholds $I_{OFF1}$ and $I_{OFF2}$.

Figure 14:
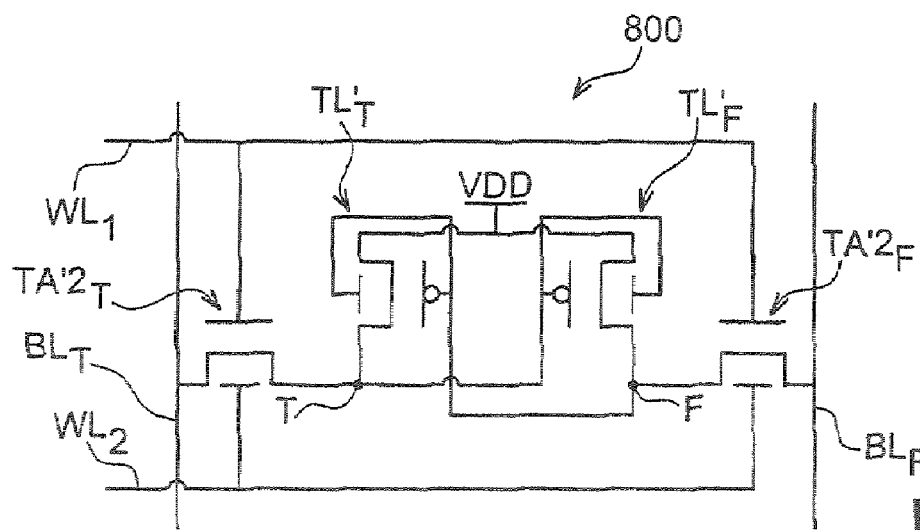
FIG. 14 illustrates another example of a memory cell according to the invention, provided with 4 double-gate transistors and two word lines, and including two asymmetric double-gate access transistors.

Another example of a random access memory cell 800 according to the invention is shown in FIG. 14.

This memory cell 800 is a 4T cell provided with 4 transistors made in double gate technology, that is different from the cell 300 described above with reference to FIG. 6, in that it comprises a first asymmetric double gate access transistor $TA'2_T$ and a second asymmetric double gate access transistor $TA'2_F$.

In this example, a word line $WL_2$ dedicated to write operations only, may also be connected to the lower gate of access transistors $TA'2_T$ and $TA'2_F$ while the other word line $WL_1$, is connected to the upper gate of access transistors $TA'2_T$ and $TA'2_F$.

Figure 15:
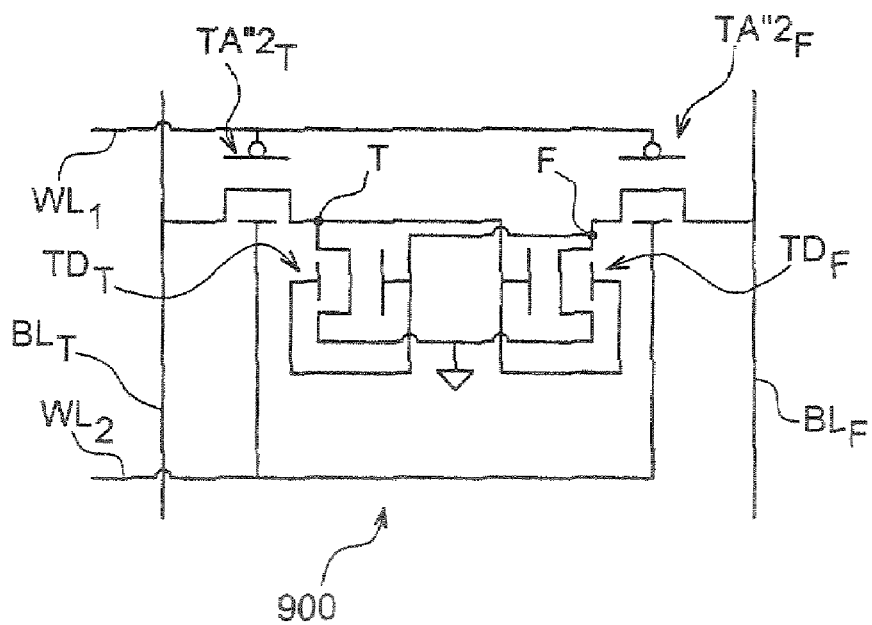
FIG. 15 illustrates one variant example of the cell in FIG. 14, also provided with 4 double-gate transistors, two word lines, and including two asymmetric double-gate access transistors.

Another example of random access memory cell 900 according to the invention is shown in FIG. 15. This memory cell 900 is a 4T cell, provided with 4 transistors made in double gate technology, and that is different from the cell 400 described above with reference to FIG. 8, in that it comprises a first asymmetric double gate access transistor $TA''2_T$ and a second asymmetric double gate access transistor $TA''2_F$.

The cells 700, 800, 900 described above, with two word lines and comprising asymmetric double gate access transistors may be integrated in a plane or a multiplexed memory matrix.

Figure 16:
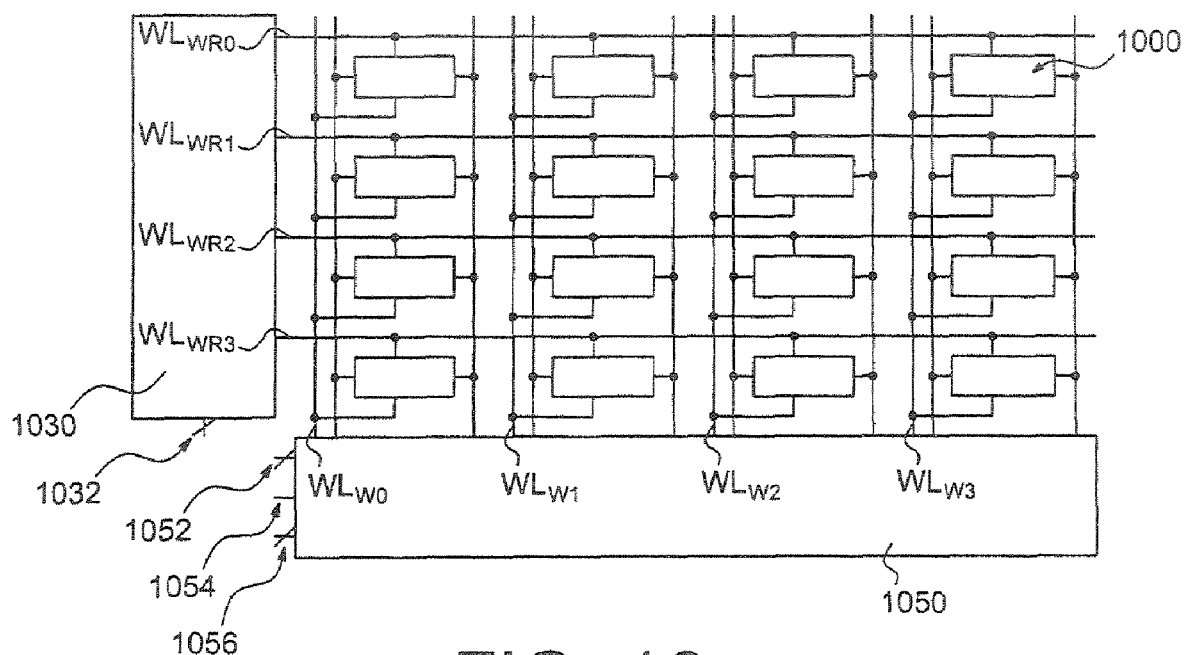
FIG. 16 illustrates one example of a matrix cell according to the invention, comprising a line decoder connected to a first plurality of word lines dedicated to read and write operations, a column decoder connected to a second plurality of word lines.

One example of such a matrix comprising cells 1000 of the same type as cells 700, 800, 900 described above, is illustrated in FIG. 16.

In this example, the matrix comprises crossed word lines. A first plurality of word lines $WL_{WR0}, \ldots, WL_{WR3}$ dedicated to the read and/or write command, is connected to means forming a line decoder 1030. The word lines $WL_{WR0}, \ldots, WL_{WR3}$ in the first plurality of word lines $WL_{WR0}, \ldots, WL_{WR3}$ are connected to corresponding cells in the same row of the matrix.

A second plurality of word lines $WL_{W0}, \ldots, WL_{W3}$, orthogonal to the lines of the first plurality of word lines, is connected to means 1050 forming a column decoder. The word lines of the second plurality of word lines $WL_{W0}, \ldots, WL_{W3}$ are dedicated to the write command. The word lines $WL_{W0}, \ldots, WL_{W3}$ of the second plurality of word lines $WL_{W0}, \ldots, WL_{W3}$ are connected to corresponding cells in the same column of the matrix.

The means forming a line decoder 1030 are connected to an address bus 1032. The means forming a column decoder 1050 are connected to an address bus 1052, a data bus 1056. A signal reaching an input 1056 of decoder 1052, is used to indicate the distinction between a read mode and a write mode to the decoder 1050. A write operation in a given cell may be made when a first word line connected to said given cell and belonging to the first plurality of word lines, and a second word line connected to said given cell and belonging to said second plurality of word lines, are simultaneously activated.

In this case, memory cells located on the same row as said given cell are not disturbed by activation of the first word line, while memory cells located on the same column as the given cell are not disturbed by activation of the second word line.

According to one possible variant embodiment of the cells described above, all transistors of cell transistors with two word lines may be provided with an asymmetric double gate.

REFERENCE DOCUMENTS

[1]: K. NODA, et al., <<A 16-Mb 400-MHz loadless CMOS Four-Transistor SRAM Macro>>, IEEE JSSC, Vol. 35, No. 11, November 2000.

[2]: N. AZIZI, et al., <<Low-Leakage Asymmetric-Cell SRAM>>, IEEE TVLSI, VOL. 11, Issue 4, pp. 701-715, August 2003.

[3]: A. AGARWAL, et al., <DRG-Cache: A Data Retention Gated-Ground Cache for Low Power>>, DAC, pp. 473-478, June 2002.

[4]: K. FLAUNTER, et al., <<Drowsy Caches: Simple Techniques for Reducing Leakage Power>> ISCAS, Arizona, USA, May 2002.

[5]: K. OSADA, et al. <<16.7-fA/cell tunnel-leakage-suppressed 16-Mbit SRAM for handling cosmic-ray-induced multi-errors>>, IEEE HSSC, VOL. 38, No. 11, November 2003.

[6]: K. Takeuchi, et al., <<A Study of Threshold Voltage Variation for Ultra SmallBulk and SOI CMOS>>, IEEE TED, VOL. 48, No. 9, September 2004.

[7]: M. YAMAOKA, et al., <<Low Power SRAM Menu for SOC Application Using Yin-Yang-Feedback memory Cell Technology>>, Symposium on VLSI circuits, Digest of Technical Papers, Honolulu, USA, June 2004.

[8]: E. SEEVINCK, et al., <<Static-Noise Margin Analysis of MOS SRAM cells>>, IEEE JSSC, VOL. SC-22, No. 5, October 1987.

[9]: A. CHANDRAKASAN, et al., <<Design of High-Performance Microprocessor Circuits>>, IEEE press, pp. 285-308, FOX 2001.

[10]: J. J. KIM, et al., <<Back-Gate Controlled READ SRAM with Improved Stability>>, IEEE SOI CONFERENCE, pp. 211-212, Hawaii, USA, 2005

[11]: US 02T15 A1.

[12]: US 644060 B1.

[13]: EP 1 465 200 A1.

[14]: O. THOMAS, A. AMARA, <<An SOI 4 Transistors Self-Refresh Ultra-Low-Voltage memory cell>>, ISCAS, Thailand, Bangkok, May 2003.

The invention claimed is:

1. A random access memory cell, comprising:
a first plurality of double gate transistors; and
a first asymmetric double gate access transistor and a second asymmetric double gate access transistor arranged between a first bit line and a first storage node, and between a second bit line and a second storage node respectively, a first gate of the first access transistor and a first gate of the second access transistor being connected to a first word line capable of carrying a bias signal, a second gate of the first access transistor and a second gate of the second access transistor being connected to a second word line capable of carrying another bias signal, wherein
the first access transistor and the second access transistor with asymmetric double-gate comprise an upper gate and a lower gate respectively, and said second word line is dedicated solely to write operations into the cell, the second word line being connected to the lower gate of the access transistors.

2. The random access memory cell, as claimed in claim 1, the first plurality of transistors comprising:
a first double gate load transistor and a second double gate load transistor, the two gates of the first load transistor being connected to each other, and the two gates of the second load transistor also connected to each other; and
a first double gate conduction transistor and a second double gate conduction transistor, the two gates of the first conduction transistor being connected to each other, the two gates of the second conduction transistor also being connected to each other.

3. The random access memory cell, as claimed in claim 1, the first plurality of transistors comprising:
a first double gate load transistor and a second double gate load transistor, the two gates of the first load transistor being connected to each other, and the two gates of the second load transistor also being connected to each other;
or a first double gate conduction transistor and a second double gate conduction transistor, the two gates of each of the conduction transistors being connected to each other, the two gates of the first conduction transistor being connected to each other, the two gates of the second conduction transistor also being connected to each other.

4. The random access memory cell, as claimed in either claim 1, 2 or 3, that may adopt a retention mode in which the first word line and the second word line are connected respectively to a first retention potential and a second retention potential respectively, the first retention potential and the second retention potential being designed to block the first access transistor and the second access transistor.

5. The random access memory (RAM) cell as claimed in claim 4, the first retention potential and the second retention potential being equal.

6. The random access memory (RAM) cell, as claimed in claim 5, that can be used in a write mode in which the first word line and the second word line are at a first write potential and a second write potential respectively, the first write potential and the second write potential being designed to make the first access transistor and the second access transistor conducting or saturated.

7. The random access memory (RAM) cell, as claimed in claim 6, the first write potential and the second write potential being equal.

8. The random access memory (RAM) cell, as claimed in claim 6, that can adopt a read mode in which the first word line and the second word line are equal to a first read potential and a second read potential respectively, the first read potential and the second read potential being different.

9. The random access memory (RAM) cell, as claimed in claim 8, the first read potential and the second read potential being less than the first write potential and the second write potential respectively.

10. A microelectronic device with a random access memory (RAM), comprising a plurality of cells as claimed in claim 1.

11. The random access memory cell according to claim 1, wherein
a first voltage applied to the second word line during a write operation is different from a second voltage applied to said second word line during a read operation or a retention operation.

12. A microelectronic device, comprising:
a plurality of random access memory cells, at least one random access memory cell of the plurality of random access memory cells including
a first plurality of double gate transistors;
a first double gate access transistor and a second double gate access transistor arranged between a first bit line and a first storage node, and between a second bit line and a second storage node respectively, a first gate of the first access transistor and a first gate of the second access transistor being connected to a first word line capable of carrying a bias signal, a second gate of the first access transistor and a second gate of the second access transistor being connected to a second word line capable of carrying another bias signal;
means for selecting a block of cells; and
means for activating word lines, capable of activating one or several word lines in a first block, independently of word lines in a second block, wherein
the cells are arranged in a matrix divided into at least the first block comprising a plurality of word lines, and at least the second block comprising a plurality of word lines.

13. A microelectronic device, comprising a random access memory cell, the random access memory cell including:
a first plurality of double gate transistors;
a first double gate access transistor and a second double gate access transistor arranged between a first bit line and a first storage node, and between a second bit line and a second storage node respectively, a first gate of the first access transistor and a first gate of the second access transistor being connected to a first word line capable of carrying a bias signal, a second gate of the first access transistor and a second gate of the second access transistor being connected to a second word line capable of carrying another bias signal;
means for forming a first line or column decoder, connected to a first plurality of word lines dedicated to read and write operations; and
means for forming a second column or line decoder connected to a second plurality of word lines dedicated to write operations.

* * * * *